United States Patent
Pannizzo et al.

(10) Patent No.: US 7,486,150 B2
(45) Date of Patent: Feb. 3, 2009

(54) ELECTRIC CIRCUIT AND OSCILLATOR COMPRISING SAID ELECTRIC CIRCUIT

(75) Inventors: Ivo Pannizzo, Aosta (IT); Francesco Pulvirenti, Acireale CT (IT)

(73) Assignees: STMicroelectronics S.r.l., Agrate Brianza (IT); DORA S.p.A., Aosta (IT)

( * ) Notice: Subject to any disclaimer, the term of this patent is extended or adjusted under 35 U.S.C. 154(b) by 362 days.

(21) Appl. No.: 11/353,870

(22) Filed: Feb. 14, 2006

(65) Prior Publication Data

US 2006/0197612 A1    Sep. 7, 2006

(30) Foreign Application Priority Data

Feb. 18, 2005    (EP) .................................. 05425080

(51) Int. Cl.
*H02J 7/00*     (2006.01)
*H02M 3/06*     (2006.01)
*H03K 3/02*     (2006.01)
*H03K 3/353*    (2006.01)

(52) U.S. Cl. ........................ 331/111; 331/143; 331/186; 320/166; 307/109

(58) Field of Classification Search ................ 331/111, 331/113 R, 143, 144, 185, 186; 307/109; 320/166

See application file for complete search history.

(56) References Cited

U.S. PATENT DOCUMENTS

| | | | |
|---|---|---|---|
| 5,699,024 A | 12/1997 | Manlove et al. | 331/111 |
| 6,107,894 A | 8/2000 | Van Tuijl et al. | 331/143 |
| 6,157,265 A | 12/2000 | Hanjani | 331/49 |
| 6,362,697 B1 | 3/2002 | Pulvirenti | 331/111 |
| 6,870,433 B2 * | 3/2005 | Motz | 331/111 |

FOREIGN PATENT DOCUMENTS

| | | |
|---|---|---|
| EP | 1 049 256 A1 | 11/2000 |
| WO | WO 00/76069 A2 | 12/2000 |

* cited by examiner

*Primary Examiner*—David Mis
(74) *Attorney, Agent, or Firm*—Lisa K. Jorgenson; Robert Iannucci; Seed IP Law Group PLLC

(57) ABSTRACT

An electric circuit includes a circuit path from a first reference voltage to a second reference voltage lower than the first reference voltage. The path includes a current generator, a capacitor, a first switching element suitable for connecting or disconnecting the capacitor with respect to the current generator. The first switching element has a triggering value and the electric circuit includes a second switching element placed in parallel to the capacitor and control elements suitable for acting on the first and second switching elements for controlling the charging and discharging of the capacitor. The control elements comprise a comparator operable during the charging of the capacitor and suitable for acting on the first switching element for blocking the charging of the capacitor when the voltage value at its terminals reaches a threshold voltage value. The threshold voltage value is lower than the triggering voltage of the first switching element and higher than the second reference voltage.

21 Claims, 4 Drawing Sheets

ELECTRIC CIRCUIT AND OSCILLATOR COMPRISING SAID ELECTRIC CIRCUIT

BACKGROUND OF THE INVENTION

1. Field of the Invention

The present invention refers to an electric circuit and an oscillator comprising said electric circuit.

2. Description of the Related Art

Circuit structures are generally known that supply triangular or square waveform signals. Said circuits are frequency oscillators and are widely used in digital and analog circuitries. The main characteristics of a good oscillator are to operate at high frequency and to have an oscillation frequency that is independent from the supply voltage, the variations of the process and the temperature and to have a duty-cycle defined by a constant ratio. Many oscillators however present inconveniences linked to the dependence of the oscillation frequency and of the duty-cycle on the values of the threshold voltages of the inverters.

A low supply voltage oscillator is described in EP 1049256. Said oscillator has a symmetrical structure and comprises two circuit stages having a specular circuit structure and placed between a supply voltage and ground. The oscillator also comprises two capacitors placed between the supply voltage and ground and said stages serve to charge and discharge said capacitors in alternated mode. The stages are connected together by means of a memory element formed by a bistable device or by a flip-flop. Each of the two circuit stages comprises a constant current generator suitable for charging the capacitor, a first MOS transistor having the gate terminal connected to the common terminal of the capacitor and of the current generator and a second MOS transistor placed in parallel to the capacitor. The capacitor is charged until the voltage at its terminals reaches the threshold voltage of the first MOS transistor; the discharge of the capacitor comes about by turning on the second MOS transistor. Thus an inconvenience of said oscillator lies in the fact that the charging time and therefore the oscillation frequency depend on the threshold voltage of the MOS transistor.

BRIEF SUMMARY OF THE INVENTION

One embodiment of the present invention provides an electric circuit in which the charging time of the capacitor is independent from the triggering voltage of the switches used.

One embodiment of the present invention is an electric circuit comprising a circuit path from a first reference voltage to a second reference voltage lower than the first reference voltage. The path includes a current generator, at least one capacitor, a first switching element suitable for connecting or disconnecting the at least one capacitor with respect to the current generator, the first switching element having a triggering value. The electric circuit includes a second switching element placed in parallel to the at least one capacitor, and control means suitable for acting on the first and second switching elements for controlling the charging and discharging of the at least one capacitor. The control means comprise further means operable during the charging of the at least one capacitor and suitable for acting on the first switching element for blocking the charging of the at least one capacitor when the voltage value at its terminals reaches a threshold voltage value, the threshold voltage value being lower than the triggering voltage of the first switching element and higher than the second reference voltage.

BRIEF DESCRIPTION OF THE SEVERAL VIEWS OF THE DRAWINGS

The characteristics and advantages of the present invention will appear evident from the following detailed description of an embodiment thereof, illustrated as non-limiting example in the enclosed drawings, in which.

DETAILED DESCRIPTION OF THE INVENTION

Figure 1:
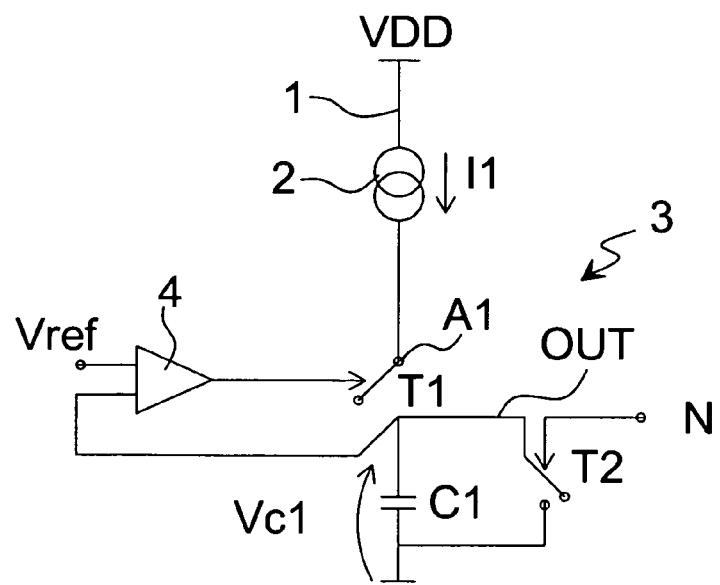
FIG. 1 is a diagram of an electric circuit in accordance with the invention.

With reference to FIG. 1, a diagram of an electric circuit in accordance with the invention is shown. Said circuit comprises a circuit path or line 1 from a first reference voltage, the supply voltage VDD, to a second reference voltage, preferably ground. The path comprises a current generator 2 suitable for supplying a constant current I1, a capacitor C1, a first switching element T1 suitable for connecting or disconnecting said capacitor with respect to said current generator 2; preferably said first switching element T1 is formed of a bipolar transistor or a MOS transistor and has a given triggering or turn-on voltage value, that is the value of the voltage between base and emitter for a bipolar transistor and the value of the threshold voltage for the MOS transistor. The electric circuit comprises a second switching element T2 placed in parallel to the capacitor C1 and control structures 3 of the first T1 and of the second T2 switching elements; the control structures 3 are suitable for acting on switching elements T1 and T2 for controlling the charging and discharging of the capacitor C1. The control structures 3 comprise a comparator 4 operable during the charging of the capacitor C1 and suitable for acting on the first switching element T1 for blocking the charging of the capacitor C1 when the voltage value Vc1 at its terminals reaches a predefined voltage value Vref. More precisely the comparator 4 has an input terminal connected with the common terminal of the capacitor C1 and of the first switching element T1 and the other input terminal connected to a reference voltage Vref. The first switching element T1 is closed while the second switching element T2 is opened for enabling the charging of the capacitor C1; when the voltage Vc1 at its terminals equals the voltage Vref, the comparator 4 changes state and acts on the switch T1 to open it. The value of the voltage Vref is lower than the value of the triggering voltage of the first switching element T1 and higher than ground.

After the opening of the first switching element T1, the second switching element T2 is closed to enable the discharging of the capacitor C1 towards ground. A signal N commands the closing of the switch T2. The signal taken from the node OUT will have a triangular waveform.

The period of time Tc1 for charging the capacitor C1 is given by Tc1=(C1*Vc1)/I1, therefore the period of time for charging the capacitor C1 does not depend on the triggering voltage of the switching element T1; in addition, said charging time Tc1 is also shorter than the charging times of the capacitors of the known electric circuits given that the voltage Vc1 is lower than the triggering voltage of the switching element T1.

Figure 2:
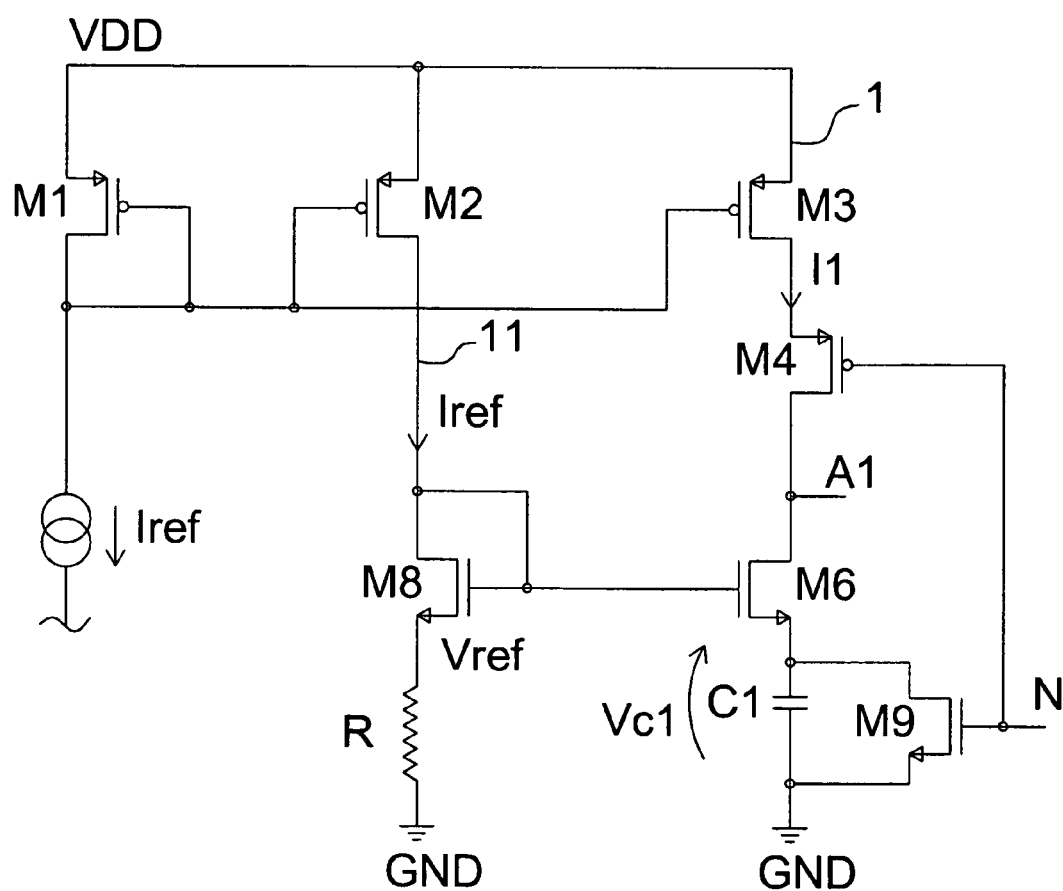
FIG. 2 is a circuit implementation of the electric circuit of FIG. 1.

FIG. 2 shows a circuit implementation of the electric circuit of FIG. 1. The switching elements T1 and T2 are implemented by respective MOS transistors M6 and M9. The current I1 is produced on the circuit branch 1 by means of the PMOS mirror M1-M3 that mirrors a current I1 proportional to the current Iref with I1=m*Iref; the same current Iref is mirrored on a circuit branch 11 by means of the PMOS mirror M1-M2 and permits the definition of the voltage Vref flowing through the resistance R connected to ground GND. The resistance R is connected to the transistor M2 by a diode-connected transistor M8 and a PMOS transistor M4 connects the transistors M3 and M6; the transistor M4 is driven by the same signal N that drives the transistor M9. The comparator 4 of FIG. 1 comprise the transistors M8 and M6.

When the signal N has a low value, the transistor M9 is off and the transistor M4 is on and, as the transistor M6 is also on, the capacitor C1 is charged. When the voltage Vc1=Vref, the threshold voltages of the transistors M8 and M6 being the same, the transistor M6 will turn off impeding the passage of current in the circuit branch 1; the node A1 will be at the voltage VDD.

Figure 3:
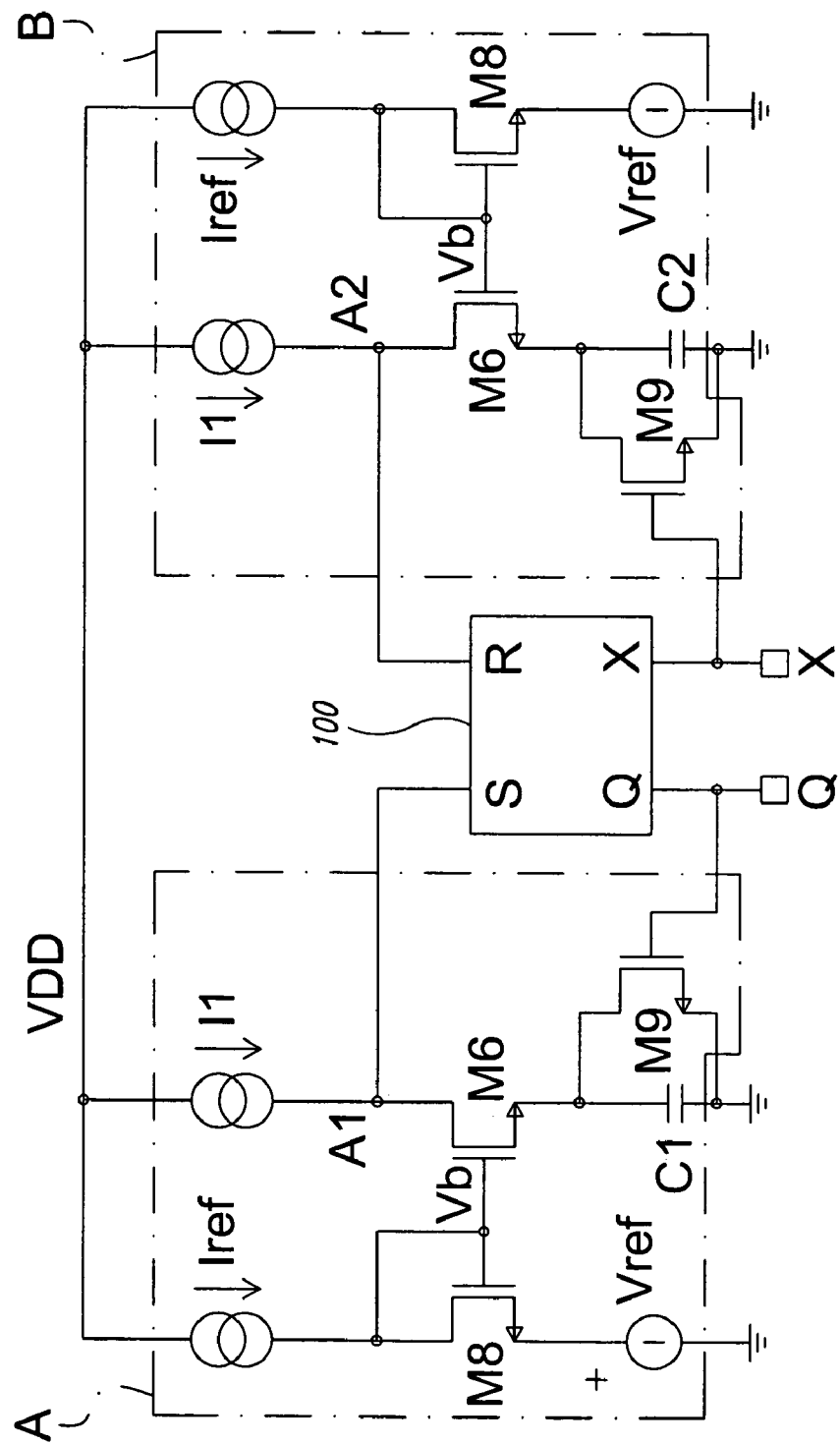
FIG. 3 is a circuit diagram of an oscillator according to an embodiment of the present invention.

In FIG. 3 a circuit diagram of an oscillator is described, comprising the electric circuit of FIGS. 1-2, in accordance with one embodiment of the present invention. The oscillator shows a symmetrical circuit structure comprising a first stage A and a second stage B in mirror configuration. The stages A and B are connected between the supply voltage VDD and ground and are connected together through a memory element 100. The stages A and B comprise an electric circuit as described in FIG. 1 and implemented in FIG. 2.

The only difference of the stages A and B in relation to the circuit of FIG. 1 lies in the lack of the transistor M4. The memory element 100 is formed by a set-reset flip-flop of the known type in which the set S and reset R inputs are connected with the drain terminals A1 and A2 of the NMOS transistors M6 of the two stages A and B and the outputs Q and X are connected to the gate terminals of the transistors M9 of the respective stages A and B; the output X is the output Q negated.

Let us suppose initially that the output Q is high, the output X is low and the voltages Vc1 and Vc2 at the terminals of the capacitors C1 and C2 are null. The transistor M9 of the stage A is on and the voltage Vc1 is forced to remain null; the voltage on the gate terminal of the transistor M6 of the stage A is Vb=Vref+Vth where Vth is the threshold voltage of the MOS transistor and therefore said transistor M6 is on. The transistor M9 of the stage B is off and the voltage between gate and source of the transistor M6 is Vb−Vc2 where Vb=Vref+Vth. Until the voltage value Vb−Vc2 is higher than the threshold voltage Vth the transistor M6 of the stage B remains on and the current I1 can charge the capacitor C2. The voltage Vc2 reaches the maximum value, that is Vc2max=Vref and we can define the charging time Tc2= (C2*Vc2max)/I1=(C2*Vref)/I1. With Vc2=Vref the transistor M6 of the stage B turns off, no current passes through it and the voltage on the node A2 goes to the voltage VDD. With the situation R=VDD and S=0 given that the voltage on the node A1 is low there is a change of state of the set-reset flip-flop 100. As already described for the circuit stage B, in the circuit stage A the charging of the capacitor C1 comes about in the charging period Tc1. Supposing that C1=C2=C we have f=I1/(2*C*Vref) and as Vref=R*Iref and I1=m*Iref we have f=m/2*C*R.

Figure 4:
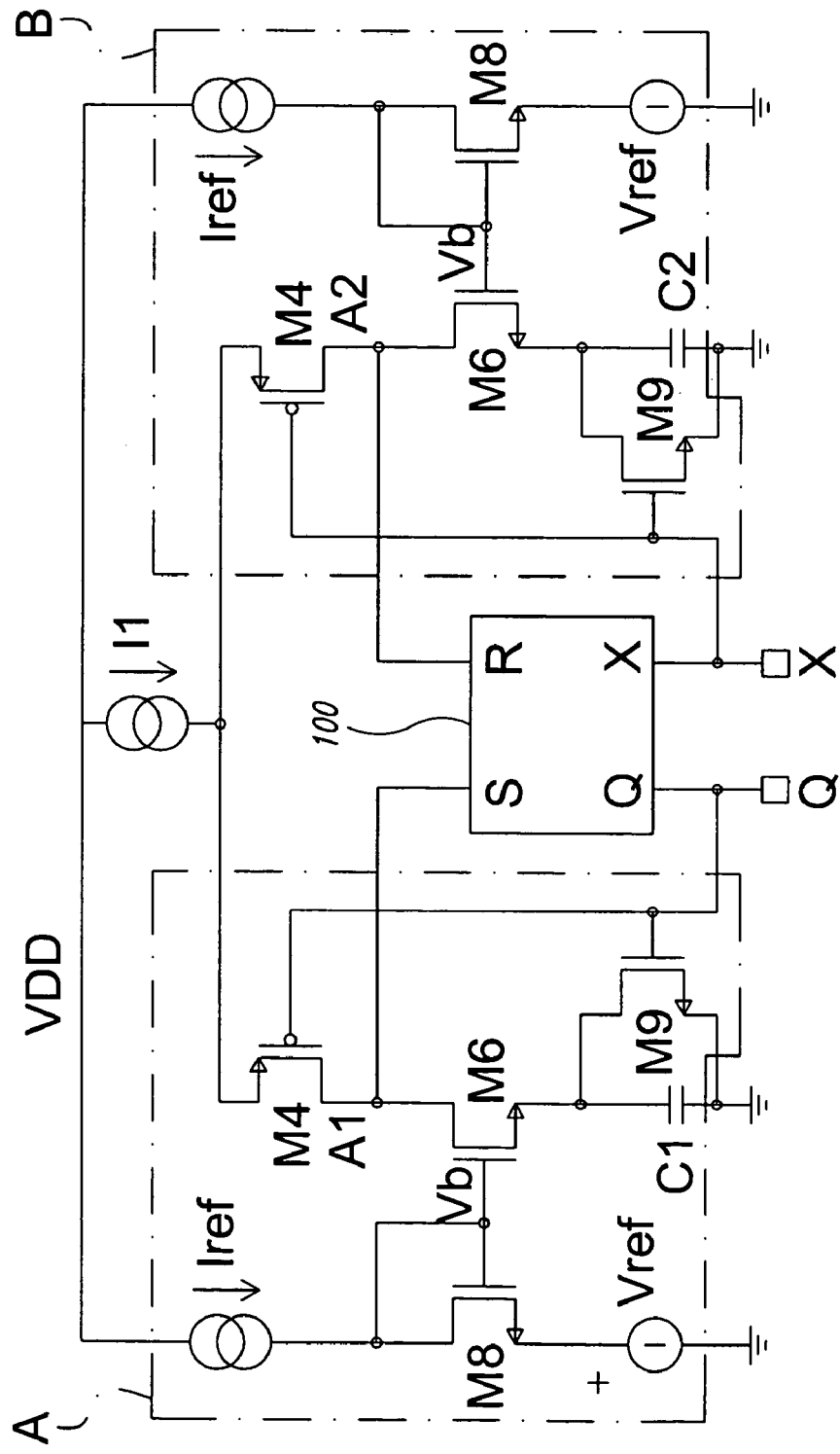
FIG. 4 is a circuit diagram in accordance with a variant of the embodiment of the oscillator of FIG. 3.

FIG. 4 shows an oscillator in accordance with a variant of the embodiment of the invention shown in FIG. 3. The oscillator of FIG. 4 differs from the oscillator of FIG. 3 only for the presence of the transistor M4 for each of the stages A and B. The PMOS transistor M4 of the stage A is driven by the signal Q while the transistor M4 of the stage B is driven by the signal X; the drain terminal of the transistor M4 of the stage A is connected with the node A1 while the drain terminal of the transistor M4 of the stage B is connected with the node A2; the source terminals of the transistors M4 are both connected with the current generator I1 connected to the supply voltage VDD. The transistors M4 are driven to switch correctly the current I1 for alternately charging the capacitors C1 and C2.

Figure 5:
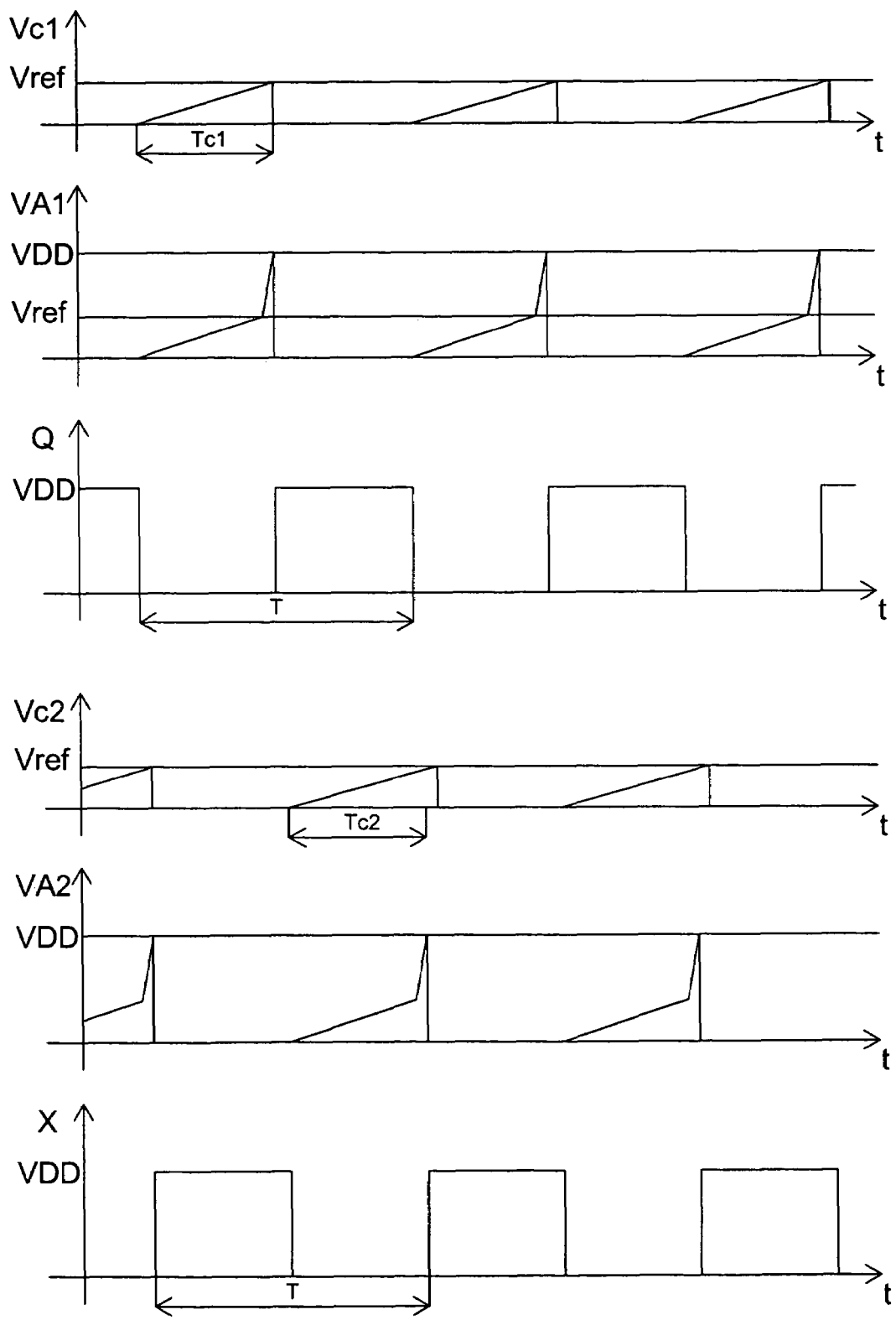
FIG. 5 shows time diagrams of signals in the oscillator of FIG. 3.

FIG. 5 shows the time diagrams of the signals Vc1, Vc2, of the voltages VA1, VA2 on the nodes A1 and A2 and of the signals X and Q for the oscillator of FIG. 4.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. An electric circuit, comprising:
   a circuit path from a first reference voltage terminal to a second reference voltage terminal, said path comprising means for supplying current, at least one capacitor, first switching means for connecting or disconnecting said at least one capacitor with respect to said means for supplying current, said first switching means having a triggering value;
   second switching means placed in parallel to said at least one capacitor; and
   control means for acting on said first and second switching means for controlling charging and discharging of said at least one capacitor, said control means including further means, operable during the charging of said at least one capacitor, for acting on said first switching means for blocking the charging of said at least one capacitor when a voltage value across the at least one capacitor reaches a threshold voltage value, said threshold voltage value being lower than the triggering voltage of said first switching means.

2. The circuit according to claim 1, further comprising a resistance through which a constant current flows, the threshold voltage value being obtained at one terminal of the resistance.

3. The circuit according to claim 1 wherein said first switching means include a bipolar transistor.

4. The circuit according to claim 1 wherein said first switching means include a MOS transistor.

5. The circuit according to claim 4, further comprising a resistance through which a constant current flows, the resistance having a first terminal connected to the second reference voltage terminal and a second terminal at which the threshold voltage value is obtained, wherein said further means comprise:
   a diode-connected first MOS transistor having a source terminal connected to said resistance, and a drain terminal connected to said current supply means; and
   a second MOS transistor having a source terminal connected to said capacitor, a gate terminal connected to a gate terminal of the first MOS transistor and a drain terminal coupled with said current supply means.

6. The circuit according to claim 5, further comprising other means suitable for maintaining the drain terminal of said second MOS transistor at a voltage close to the supply voltage during the discharge of said capacitor.

7. The circuit according to claim 5, wherein said further means comprise a third MOS transistor having a first conduction terminal connected to the drain terminal of said second MOS transistor and a second conduction terminal connected to said current supply means, said third MOS transistor being turned on by said control means during the discharge of said capacitor.

8. A symmetrical circuit structure oscillator, comprising:
a memory element; and
a first stage and a second stage in mirror configuration, said first and second stage being connected between a first reference voltage terminal and a second reference voltage terminal and being connected together through the memory element, each of said first and second stages comprising an electric circuit that includes:
a circuit path from the first reference voltage terminal to the second reference voltage terminal, said path comprising means for supplying current, at least one capacitor, first switching means for connecting or disconnecting said at least one capacitor with respect to said means for supplying current, said first switching means having a triggering value;
second switching means placed in parallel to said at least one capacitor; and
control means suitable for acting on said first and second switching means for controlling charging and discharging of said at least one capacitor, said control means including further means operable during the charging of said at least one capacitor and suitable for acting on said first switching means for blocking the charging of said at least one capacitor when a voltage value across the at least one capacitor reaches a threshold voltage value, said threshold voltage value being lower than the triggering voltage of said first switching means.

9. The oscillator according to claim 8, wherein said memory element is a set-reset flip-flop having a first input terminal connected to said first stage, a second input terminal connected to said second stage, a first output terminal driving said second switching means of the first stage, and a second output terminal driving the second switching means of the second stage.

10. The oscillator according to claim 9, wherein the first input terminal of said set-reset flip-flop is connected to a terminal of the first switching means of the first stage and the second input terminal of said set-reset flip-flop is connected to a terminal of the first switching means of the second stage.

11. An electric circuit, comprising:
a first circuit branch connected between first and second reference voltage terminals, the first circuit branch including a first capacitor and a first switch selectively connecting a current generator to the first reference voltage terminal, the first switch having a control terminal; and
a second circuit branch connected between the first and second reference voltage terminals, the second circuit branch including a diode-connected second switch, the second switch having a control terminal connected to the control terminal of the first switch.

12. The circuit of claim 11, wherein the second circuit branch includes a resistance connected between the second switch and the second reference voltage terminal.

13. The circuit of claim 11 wherein the first and second switches are MOS transistors.

14. The circuit of claim 11, further comprising a third switch connected in parallel with the first capacitor and structured to selectively discharge the first capacitor.

15. The circuit of claim 14 wherein the first branch includes a fourth switch connected between the current generator and the first switch, the fourth switch having a control terminal connected to a control terminal of the third switch.

16. The circuit of claim 11 wherein the first branch includes a first current generator connected between the first switch and the first reference voltage terminal and the second branch includes a second current generator connected between the second switch and the first reference voltage terminal.

17. The circuit of claim 16 wherein the first current generator includes a first transistor and the second current generator includes a second transistor, the circuit further comprising:
a third current generator; and
a diode-connected third transistor forming a first current mirror with the first transistor and a second current mirror with the second transistor.

18. The circuit of claim 11, further comprising:
a third circuit branch connected between the first and second reference voltage terminals, the third circuit branch including a second capacitor and a third switch selectively connecting the second capacitor to the first reference voltage terminal, the third switch having a control terminal; and
a fourth circuit branch connected between the first and second reference voltage terminals, the fourth circuit branch including a diode-connected fourth switch, the fourth switch having a control terminal connected to the control terminal of the third switch;
a fifth switch connected in parallel with the first capacitor and structured to selectively discharge the first capacitor;
a sixth switch connected in parallel with the second capacitor and structured to selectively discharge the second capacitor; and
a flip-flop having a first input terminal connected to the first switch, a second input terminal connected to the third switch, a first output terminal connected to a control terminal of the fifth switch, and a second output terminal connected to a control terminal of the sixth switch.

19. The circuit of claim 18 wherein:
the first branch includes a seventh switch connected between the first switch and the first reference voltage terminal, the seventh switch having a control terminal connected to a control terminal of the fifth switch; and
the second branch includes an eighth switch connected between the third switch and the first reference voltage, the eighth switch having a control terminal connected to a control terminal of the sixth switch.

20. The circuit of claim 18 wherein the first branch includes a first current generator connected between the first switch and the first reference voltage terminal, the second branch includes a second current generator connected between the second switch and the first reference voltage terminal, the third branch includes a third current generator connected between the third switch and the first reference voltage terminal, and the fourth branch includes a fourth current generator connected between the fourth switch and the first reference voltage terminal.

21. The circuit of claim 18, further comprising a first current generator connected between the first reference voltage terminal and a common node connected to the first and second third switches.

* * * * *